(12) United States Patent
Yeh et al.

(10) Patent No.: US 10,861,768 B2
(45) Date of Patent: Dec. 8, 2020

(54) IGBT MODULE WITH IMPROVED HEAT DISSIPATION STRUCTURE

(71) Applicant: AMULAIRE THERMAL TECHNOLOGY, INC., New Taipei (TW)

(72) Inventors: Tze-Yang Yeh, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 16/442,538

(22) Filed: Jun. 16, 2019

(65) Prior Publication Data

US 2020/0185303 A1 Jun. 11, 2020

(30) Foreign Application Priority Data

Dec. 5, 2018 (TW) .............................. 107143684 A

(51) Int. Cl.
*H01L 23/373* (2006.01)
*H01L 29/739* (2006.01)
*H01L 23/367* (2006.01)

(52) U.S. Cl.
CPC ........ *H01L 23/3735* (2013.01); *H01L 23/367* (2013.01); *H01L 23/3731* (2013.01); *H01L 23/3737* (2013.01); *H01L 29/7393* (2013.01)

(58) Field of Classification Search
None
See application file for complete search history.

(56) References Cited

U.S. PATENT DOCUMENTS

| 2010/0230086 A1* | 9/2010 | Tsuzuki .............. H01L 23/3735 165/185 |
| 2015/0255419 A1* | 9/2015 | Nishimoto ........ H01L 23/49822 257/773 |
| 2018/0291249 A1* | 10/2018 | Yamada .................. C08L 83/06 |
| 2019/0300999 A1* | 10/2019 | Yamaguchi ............. C23C 4/134 |

FOREIGN PATENT DOCUMENTS

TW 201536124 A 9/2015

\* cited by examiner

*Primary Examiner* — Dung A. Le
(74) *Attorney, Agent, or Firm* — Li & Cai Intellectual Property Office

(57) ABSTRACT

An IGBT module with an improved heat dissipation structure includes a layer of IGBT chips, a bonding layer, a thick copper layer, a polymer composite layer, a thermal spray layer, and a heat dissipation layer. The thermal spray layer is disposed on the heat dissipation layer. The polymer composite layer is disposed on the thermal spray layer. The thick copper layer is disposed on the polymer composite layer. The bonding layer is disposed on the thick copper layer. The layer of IGBT chips is disposed on the bonding layer.

5 Claims, 2 Drawing Sheets

IGBT MODULE WITH IMPROVED HEAT DISSIPATION STRUCTURE

CROSS-REFERENCE TO RELATED PATENT APPLICATION

This application claims the benefit of priority to Taiwan Patent Application No. 107143684, filed on Dec. 5, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an IGBT (Insulated Gate Bipolar Transistor) module, and more particularly to an IGBT module with an improved heat dissipation structure.

BACKGROUND OF THE DISCLOSURE

Most high-power inverters currently used in electric vehicles/hybrid vehicles use IGBT (Insulated Gate Bipolar Transistor) chips. Therefore, the heat generated by the high-power inverters during operation will cause the IGBT chip temperature to rise. If no proper heat dissipation measures are incorporated, the temperature of the IGBT chip may exceed the allowable temperature, resulting in deterioration of performance and damage. Therefore, the IGBT heat dissipating efficiency has become a major problem in the industry.

At present, the direct bonded copper (DBC) substrate has become the material of choice for IGBT heat dissipation structures. Referring to FIG. 1 and FIG. 2, the conventional IGBT module with the heat dissipation structure mainly includes a layer 11A of IGBT chips, an upper solder layer 12A, a DBC substrate 13A, a lower solder layer 14A, and a heat dissipation layer 15A. Among them, the DBC substrate 13A includes, from top to bottom, an upper metal layer 131A, a ceramic layer 132A, and a lower metal layer 133A.

However, the DBC substrate 13A has a limited ability of spreading heat. When heat is generated by the layer 11A of IGBT chips, it cannot be transferred to the heat dissipation layer 15A through the DBC substrate 13A in time. Moreover, the connection between the DBC substrate 13A and the heat dissipation layer 15A can only be made through the lower solder layer 14A. In practice, the entire lower solder layer 14A is highly prone to experience an empty soldering phenomenon and causes an increase in interface impedance, thereby affecting the effectiveness of thermal conductivity.

SUMMARY OF THE DISCLOSURE

One objective of the present disclosure is to provide an IGBT module with an improved heat dissipation structure that can overcome the aforementioned drawbacks.

In one aspect, the present disclosure provides an IGBT module with an improved heat dissipation structure, including a layer of IGBT chips, a bonding layer, a thick copper layer, a polymer composite layer, a thermal spray layer, and a heat dissipation layer. The thermal spray layer is disposed on the heat dissipation layer. The polymer composite layer is disposed on the thermal spray layer. The thick copper layer is disposed on the polymer composite layer. The bonding layer is disposed on the thick copper layer. The layer of IGBT chips is disposed on the bonding layer.

Preferably, the thermal spray layer is composed of a ceramic material.

Preferably, the ceramic material is selected from aluminum oxide, aluminum nitride or silicon nitride.

Preferably, the thermal spray layer has a thickness of about 20-500 µm.

Preferably, the polymer composite layer is bonded onto the thermal spray layer by screen printing or hot pressing, and the thick copper layer is bonded onto the polymer composite layer by hot pressing.

Preferably, the polymer composite layer is an epoxy-based composite, a polyimide-based composite or a PP-based composite.

Preferably, the polymer composite layer includes at least one of the following fillers: alumina, aluminum nitride, silicon nitride, silicon carbide, or boron nitride.

Preferably, the polymer composite layer has a thickness of about 20-200 µm.

Preferably, the thick copper layer has a thickness equal to or greater than 1000 µm.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
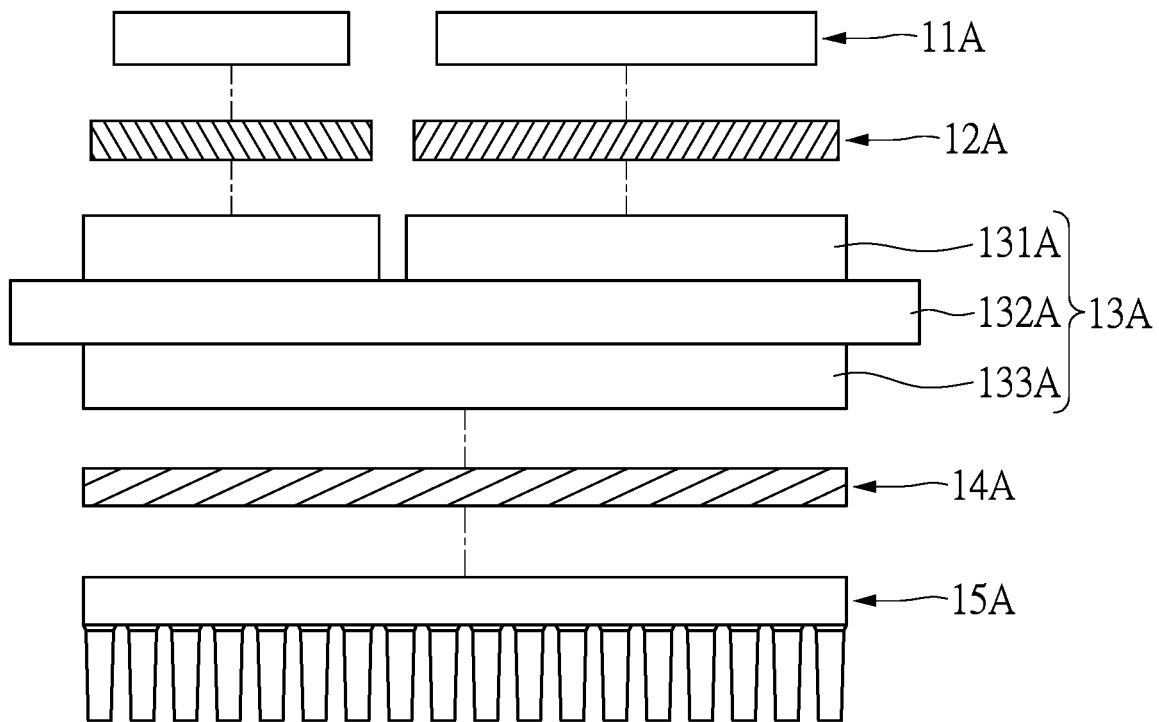
FIG. 1 is an exploded side schematic view illustrating a conventional IGBT module with a heat dissipation structure.
Figure 2:
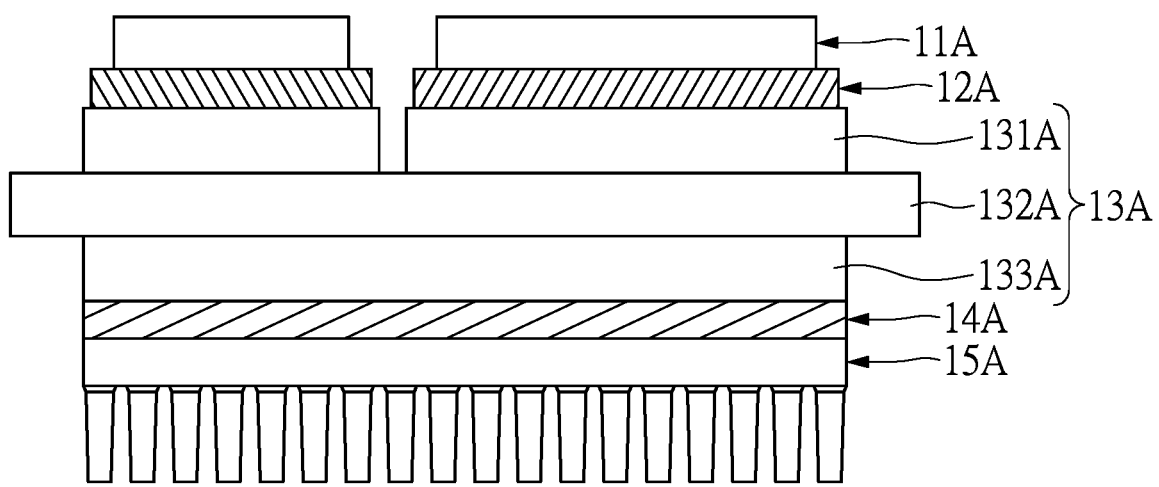
FIG. 2 is a side schematic view illustrating a conventional IGBT module with a heat dissipation structure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
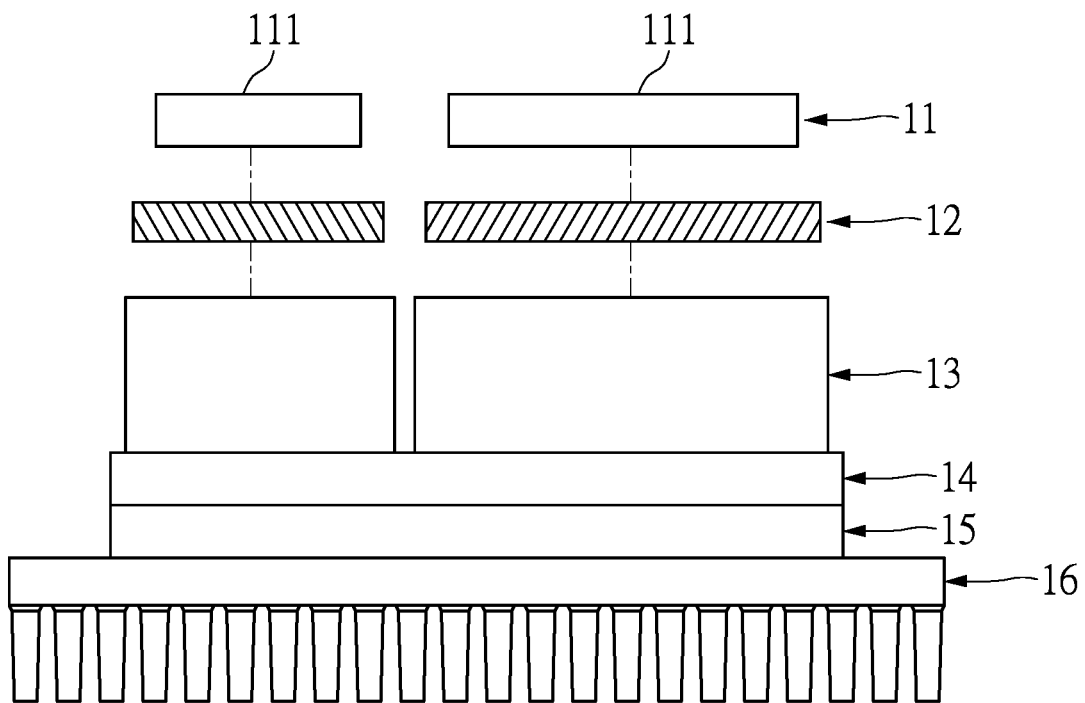
FIG. 3 is an exploded side schematic view illustrating an IGBT module with an improved heat dissipation structure of the present disclosure.
Figure 4:
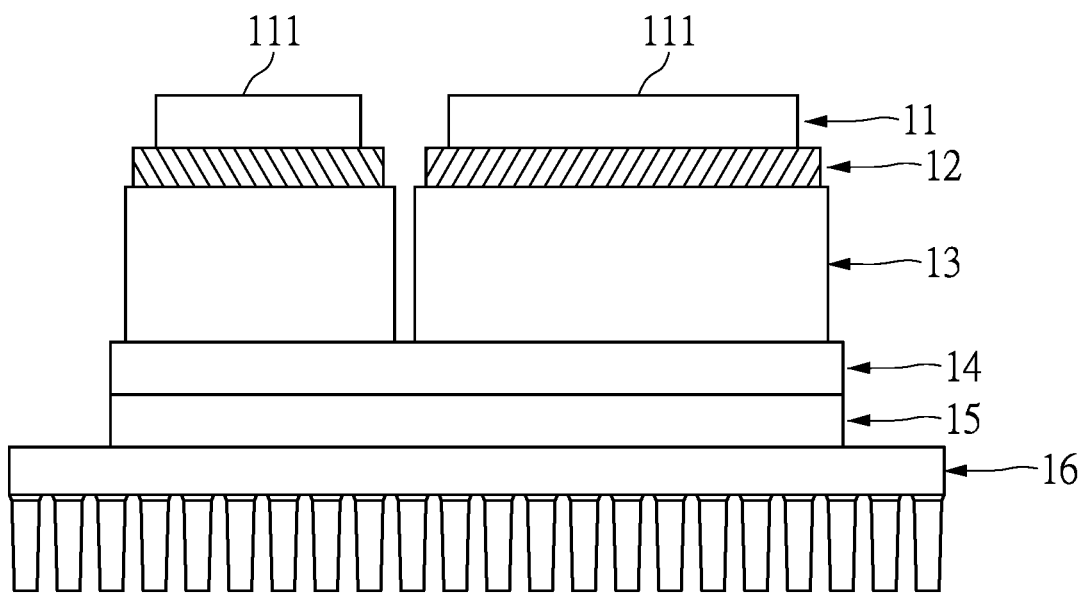
FIG. 4 is a side schematic view illustrating an IGBT module with an improved heat dissipation structure of the present disclosure.

Referring to FIG. 3 to FIG. 4, the present disclosure provides an IGBT module with an improved heat dissipation structure. As shown in FIG. 3 and FIG. 4, the IGBT module with the improved heat dissipation structure in accordance with the present disclosure includes, from top to bottom, a layer 11 of IGBT chips 111, a bonding layer 12, a thick copper layer 13, a polymer composite layer 14, a thermal spray layer 15, and a heat dissipation layer 16.

The thermal spray layer 15 is disposed on the heat dissipation layer 16. The heat dissipation layer 16 can be a heat sink or a heat dissipation metal plate. The thermal spray layer 15 is composed of a ceramic material.

In detail, the thermal spray layer 15 is formed by utilizing the plasma spraying process, which raises the ceramic powder from a normal temperature to a high temperature of 2500 degrees Celsius or higher by the high heat generated by a plasma torch, thereby causing the ceramic powder to be converted from a solid state to a molten liquid state. The molten ceramic is then blown by a high-velocity plasma gas, atomized, and sprayed on the surface of the heat dissipation layer 16 to form a thermal spray layer having a predetermined thickness. The plasma gas used in the present embodiment is argon; however, nitrogen, hydrogen, and other gases may also be used.

Furthermore, the ceramic material of the thermal spray layer 15 can be selected from aluminum oxide, but it can also be selected from aluminum nitride or silicon nitride. In addition, the thickness of the thermal spray layer 15 may be set in advance according to the spraying time of the spray coating on the surface of the heat dissipation layer 16. In the present embodiment, the thermal spray layer 15 has a thickness of about 20-300 μm.

The polymer composite layer 14, to be disposed on the thermal spray layer 15, is composed of polymer composite material and can achieve the effects of heat conduction and bonding. Therefore, compared to a conventional IGBT module with a heat dissipation structure that requires a solder layer to form a connection between the DBC substrate and the heat dissipation layer, the IGBT module with the improved heat dissipation structure in accordance with the present disclosure does not need a solder layer but instead directly forms a thermal spray layer 15 on the surface of the heat dissipation layer 16 for insulation, as well as forming a polymer composite layer 14 on the surface of the thermal spray layer 15 for heat conduction and bonding. As a result, the heat conduction performance will neither be affected by the problems of empty soldering and the interface impedance of the solder layer, nor will it be affected by the multilayer structure of the DBC substrate.

In detail, the polymer composite layer 14 of the present embodiment may be an epoxy-based composite. The polymer composite layer 14 may be bonded onto the thermal spray layer 15 by screen printing or hot pressing. Furthermore, the polymer composite layer 14 may include at least one of the following fillers: alumina, aluminum nitride, silicon nitride, silicon carbide, or boron nitride.

In other embodiments, the polymer composite layer 14 may be composed of a polyimide-based composite or a PP-based composite.

In the present embodiment, the polymer composite layer 14 has a thickness of about 10-200 μm (preferably 100 μm) to achieve better heat conduction and bonding.

The thick copper layer 13 is disposed on the polymer composite layer 14 to achieve a good bond between the thick copper layer 13 and the thermal spray layer 15 through the polymer composite layer 14.

In detail, the thick copper layer 13 is preferably bonded onto the polymer composite layer 14 by hot pressing, so that the thick copper layer 13 can have a greater thickness.

In the present embodiment, the thickness of the thick copper layer 13 shall be at least greater than 1000 μm. Therefore, compared to the thickness of about 300 μm for the thin copper layer of the DBC substrate for the heat dissipation structure of the conventional IGBT module, the improved heat dissipation structure of IGBT module of the present disclosure can increase the uniformity of the heat dissipation structure and the overall heat conduction efficiency through the thick copper layer 13.

In addition, the thick copper layer 13 of the present embodiment may be composed of a thick copper plate or a thick copper block, which is bonded onto the polymer composite layer 14 by hot-pressing.

The bonding layer 12 is disposed on thick copper layer 13, and a layer of IGBT chips 11 is disposed on the bonding layer 12. The bonding layer 12 can be a tin bonding layer, but it can also be a sintered silver layer.

The layer 11 of IGBT chips 111 may include one or more IGBT chips 111. In addition, the one or more IGBT chips 111 are bonded onto the thick copper layer 13 through the bonding layer 12. The heat generated by the one or more IGBT chips 111 can be conducted to the heat dissipation layer 16 by the thick copper layer 13, the polymer composite layer 14 and the thermal spray layer 15 to be dissipated outward.

In summary, the IGBT module with the improved heat dissipation structure in accordance with the present disclosure forms the thick copper layer 13, the polymer composite layer 14 and the thermal spray layer 15 to rapidly and uniformly conduct the heat of the IGBT chips to the heat dissipation fins of the heat dissipation layer 16. Compared with the DBC substrate for the heat dissipation structure of the conventional IGBT module, the IGBT module with the improved heat dissipation structure in accordance with the present disclosure can simultaneously achieve the advantages of the heat dissipation uniformity of the thick copper layer 13 and the insulation and thermal conductivity of the thermal spray layer 15. Moreover, there is no need to have a solder layer, but instead the thermal spray layer 15 and the polymer composite layer 14 that has good bonding properties are directly formed on the surface of the heat dissipation layer 16. As such, the heat conduction performance will neither be affected by the problems of empty soldering and the interface impedance of the solder layer, nor will it be affected by the multilayer structure of the DBC substrate, thereby making the heat dissipation layer 16 capable of having maximum heat absorption and heat dissipation performances.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An IGBT module with a heat dissipation structure, comprising: a layer of IGBT chips, a bonding layer, a thick copper layer, a polymer composite layer, a thermal spray layer, and a heat dissipation layer; wherein the thermal spray layer is disposed on the heat dissipation layer, the polymer composite layer is disposed on the thermal spray layer, the thick copper layer is disposed on the polymer composite layer, the bonding layer is disposed on the thick copper layer, and the layer of IGBT chips is disposed on the bonding layer; wherein the thermal spray layer is composed of at least one ceramic material; wherein the polymer composite layer is bonded onto the thermal spray layer, and the thick copper layer is bonded onto the polymer composite layer; wherein the polymer composite layer is an epoxy-based composite, a polyimide-based composite or a PP-based composite; and wherein the polymer composite layer includes at least one of the following fillers: alumina, aluminum nitride silicon nitride silicon carbide or boron nitride.

2. The IGBT module with the heat dissipation structure according to claim 1, wherein the at least one ceramic material is selected from aluminum oxide, aluminum nitride or silicon nitride.

3. The IGBT module with the heat dissipation structure according to claim 1, wherein the thermal spray layer has a thickness of about 20-500 μm.

4. The IGBT module with the heat dissipation structure according to claim 1, wherein the polymer composite layer has a thickness of about 20-200 μm.

5. The IGBT module with the heat dissipation structure according to claim 1, wherein the thick copper layer has a thickness equal to or greater than 1000 μm.

* * * * *